United States Patent [19]

Banks

[11] Patent Number: 4,495,044
[45] Date of Patent: Jan. 22, 1985

[54] DIAMONDLIKE FLAKES

[75] Inventor: Bruce A. Banks, Olmsted Township, Cuyahoga County, Ohio

[73] Assignee: The United States of America as represented by the Administrator of the National Aeronautics and Space Administration, Washington, D.C.

[21] Appl. No.: 591,089

[22] Filed: Mar. 19, 1984

Related U.S. Application Data

[63] Continuation-in-part of Ser. No. 495,381, May 17, 1983, Pat. No. 4,437,962.

[51] Int. Cl.³ .............................................. C23C 15/00
[52] U.S. Cl. ........................... 204/192 C; 204/192 R; 204/192 N; 423/445; 423/446; 423/449; 427/39
[58] Field of Search ..................... 423/446, 445, 449; 204/192 C, 192 N; 427/39

[56] References Cited

U.S. PATENT DOCUMENTS

| | | | |
|---|---|---|---|
| 3,840,451 | 10/1974 | Golyanov et al. | 204/192 C |
| 3,949,062 | 4/1976 | Vereschagin et al. | 423/446 |
| 3,961,103 | 6/1976 | Aisenberg | 427/39 |
| 4,191,735 | 3/1980 | Nelson et al. | 423/423 |
| 4,228,142 | 10/1980 | Holcombe et al. | 423/445 |
| 4,277,293 | 7/1981 | Nelson et al. | 423/446 |
| 4,288,353 | 9/1981 | Eckel et al. | 260/28 R |
| 4,377,565 | 3/1983 | Setaka | 423/446 |
| 4,409,712 | 10/1983 | Takehara | 423/446 |
| 4,412,980 | 11/1983 | Tsuji et al. | 403/446 |
| 4,425,315 | 1/1984 | Tsuji et al. | 423/446 |
| 4,434,188 | 2/1984 | Kamo et al. | 423/446 |
| 4,437,962 | 3/1984 | Banks | 204/192 C |

FOREIGN PATENT DOCUMENTS 1008618 10/1965 United Kingdom .

OTHER PUBLICATIONS

Mathine et al., Chem. Abstracts 99, (1983), #148673.

Primary Examiner—Arthur P. Demers
Attorney, Agent, or Firm—Norman T. Musial; John R. Manning

[57] ABSTRACT

A carbon coating (36) is vacuum arc deposited on a smooth surface of a target (10) which is simultaneously ion beam sputtered. The bombarding ions have sufficient energy to create diamond bonds. Spalling occurs as the carbon deposit thickens. The resulting diamondlike carbon flakes (26) have improved thermal, electrical, mechanical, and tribological properties when used in aerospace structures and components.

19 Claims, 1 Drawing Figure

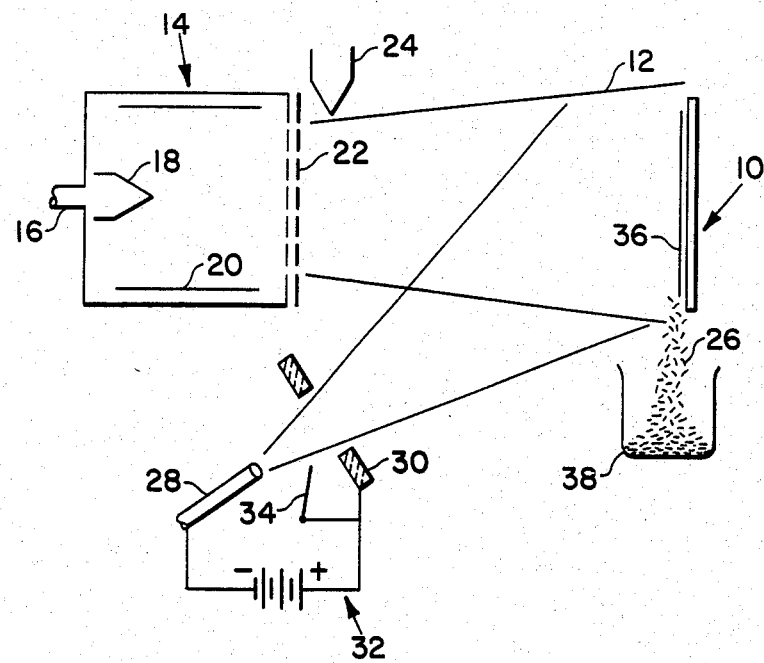

DIAMONDLIKE FLAKES

ORIGIN OF THE INVENTION

The invention described herein was made by an employee of the United States Government and may be manufactured or used by or for the Government without the payment of any royalties thereon or therefor.

STATEMENT OF COPENDENCY

This application is a continuation-in-part of application Ser. No. 495,381 which was filed May 17, 1983 and issued as U.S. Pat. No. 4,437,962.

TECHNICAL FIELD

This invention is concerned with producing diamondlike carbon flakes. The properties of the flakes produce desirable thermal, electrical, mechanical, and tribological properties when used in aerospace structures and components. These diamondlike carbon flakes are particularly useful as a filler material in a composite.

Previous composite materials were made from fibers, fiber bundles, and woven fiber bundles as the strength providing component in a composite material. Fibers of graphite, boron, tungsten, and glass have been used frequently in conjunction with various organic and metallic binders. Oftentimes these materials did not have the high tensile strength and other properties required of the composite material.

It is, therefore, an object of the present invention to provide carbon flakes having diamondlike properties. Another object of the invention is to provide a method of making diamondlike carbon flakes.

BACKGROUND ART

Aisenberg U.S. Pat. No. 3,961,103 discloses the deposition of a carbon-diamond film on a substrate by ionizing and electrostically accelerating a beam of atomic particles of carbon. A plasma ion source produces plasma which contains large concentrations of ions of the species that is to be deposited on the substrate.

Eckel et al U.S. Pat. No. 4,288,353 discloses a composite contact paste produced by mixing solid constituents in the form of graphite and metal powder with a binder comprising a mixture of epoxy resin and tar. The metal powders are selected from a group include iron, aluminum, copper and alloys thereof. The resulting paste has electrical and thermal conductivity corresponding to that of carbon blocks. Neither this patent nor the Aisenberg patent is concerned with simultaneously ion beam sputtering and vacuum arc depositing to produce diamondlike flakes.

Nelson et al U.S. Pat. No. 4,191,735 discloses a method for producing synthetic diamonds utilizing an ion source from which ions of carbon and oxygen are extracted and passed through a magnetic field. This separates the carbon and oxygen beams by virtue of the different masses. A flux of carbon ions is thus produced having a sufficent energy to penetrate a diamond crystal and cause crystal growth which is predominantly internal.

British Pat. No. 1,008,618 is directed to a device for producing synthetic diamonds produced by the absorption of energies supplied by a laser beam adapted to converge upon a glass plate containing graphite inclusions. These inclusions are situated at the focal point of the optical system through which the laser beam passes, and a diamond crystal is produced by the absorption of energy supplied by the laser beam.

Both the Nelson et al patent and the British patent disclose the broad concept of utilizing a carbon ion beam or laser beam respectively, which is focused on the target to produce synthetic diamonds. These patents, however, do not disclose simultaneously ion beam sputtering and vacuum carbon arc depositing to produce diamondlike flakes.

DISCLOSURE OF INVENTION

A unique material is produced in accordance with the present invention. Carbon flakes are produced which have certain diamondlike characteristics.

The diamondlike carbon flakes are produced by the vacuum arc deposition of carbon on a smooth surface that is simultaneously ion beam sputtered. The bombarding ions have sufficient energy to create diamond bonds. As the carbon deposit on the target thickens, diamondlike carbon flakes spall from the target surface.

BRIEF DESCRIPTION OF THE DRAWING

The details of the invention will be described in connection with the accompanying drawing which is a schematic view showing the apparatus for producing diamondlike carbon flakes in accordance with the present invention.

BEST MODE FOR CARRYING OUT THE INVENTION

Referring now to the drawing, there is shown a target 10 that is exposed to a beam 12 of 50 eV to 3000 eV argon ions at current densities of 0.1 mA/cm$^2$ to 20 mA/cm$^2$. The argon ion beam 12 is furnished by an electron bombardment ion source 14 of the type developed from electric propulsion technology.

Argon gas from a suitable source, not shown, is fed through a line 16 to a cathode 18 where the gas is ionized. The argon ions are retained within a chamber containing an anode 20 about its outer periphery. Such an ion source is described in "Advances in Electronics and Electron Physics" by H. R. Kaufman, vol. 36, pages 365–373. It will be appreciated that other gasses, in addition to argon, can be used to form the bombarding ions in the beam 12. For example, xenon and hydrogen may be used, and even vaporized carbon may be provided in the ion source 14.

Extraction of the beam 12 is accomplished by a two grid ion optics system 22. Such a system is described in AIAA Paper No. 76–1017 entitled "A 30 cm Diameter Argon Ion Source". Such a double grid system includes both a screen grid and an accelerator grid. The screen grid serves to contain the discharge plasma while forming the necessary ion optics to prevent direct impingement of accelerated ions onto the accelerator grid. Ions in the near vicinity of the screen grid have a high probability of being accelerated through the openings in the screen and the accelerator grids because of the high electric fields present at the grids.

Neutralization of the ions is achieved by the interjection of electrons into the beam 12. A suitable neutralizer 24 in the form of a downstream cathode provides these electrons.

The electron bombardment ion source 14 is located in a vacuum facility which is sufficiently large to prevent back sputtered facility material from contaminating the process. The operating pressure within the vacuum facility during sputtering is about $1\times 10^{-4}$ torr or lower.

According to the present invention, diamondlike carbon flakes 26 are produced by carbon deposition on a smooth surface of the target 10 that is simultaneously being ion beam sputter bombarded by the beam 12. This carbon deposition is produced by a vacuum arc between a carbon rod cathode 28 and an annular carbon anode 30 that are connected to a suitable power supply 32. A striker wand 34 is provided to initiate the arc in a manner well known in the art.

The carbon rod cathode 28 and anode 30 are likewise positioned within the vacuum chamber. The target 10 is positioned within 50 centimeters of both the ion source 14 and the arc produced by the electrodes 28 and 30.

The vacuum carbon arc has a low voltage between 20 and 40 volts produced by the power supply 32. This arc also has a high current discharge between 25 and 200 amperes. It is contemplated that automatic feed means may be provided for the carbon rod 28 to maintain the arc.

In operation carbon vapor as well as carbon ions will leave the tip of the carbon rod cathode 28, and a portion of these will arrive at the deposition surface of the target 10 and remain there. The bombarding argon ions in the beam 12 have sufficient energy to create diamond $sp^3$ bonds in the carbon coating 36 being deposited by the vaccum arc. As the deosited carbon 36 thickens on the deposition target 10, spalling will occur due to the stresses in this deposit.

The spalled flakes 26 are then collected as they fall into a receiving container 38. The flakes 26 will vary from less than 0.1 microns in thickness to several micron thick. The shapes of the flakes 26 are normally random; however, it is contemplated that a texture patterned or embossed deposition target 10 may provide some control of the flake shape and size.

The collected flakes may be mixed with or joined by a matrix or binder in a manner described in copending patent application Ser. No. 495,381 now U.S. Pat. No. 4,437,962. A variety of low viscosity organic binders, such as epoxys, may be used.

It is evident that extremely hard diamondlike carbon flakes 26 are produced by this process, rather than softer and lower strength graphite. The unique properties of diamondlike carbon flakes are relied on for improved properties in various applications, such as the aforementioned superior composite materials. The table compares certain properties of graphite, diamondlike carbon, and diamond.

vacuum chamber toward the deposition target 10, and these gasses would condense on this target if active cooling is used to maintain a low temperature. In addition, a shutter or chopper may be placed between the carbon source and the deposition target to reduce or regulate the ratio of arrival of carbon atoms to beam ions. In certain applications the carbon deposit 36 is formed without simultaneously sputter etching the target 10.

It is contemplated that both single and dual ion beams of argon, carbon, and hydrogen may be used to deposit the diamondlike carbon material 36 on the surface 10. In addition, hydrocarbons may be used in the dual ion beam technique.

Plasma deposition and R.F. sputtering may be used to deposit carbon from hydrocarbons. Also carbon and argon may be used with the R.F. sputtering. Other deposition techniques contemplated include using a carbon-argon ion source, a vacuum arc, or a conical carbon plasma gun.

While several embodiments of the invention have been disclosed and described it will be apparent that various modifications may be made to the apparatus process.

I claim:

1. A method of making diamondlike carbon flakes comprising the steps of
   depositing carbon on a surface
   creating diamond bonds in said carbon by subjecting said carbon on said surface to a beam of ions, and
   removing diamondlike carbon flakes from said surfaces.

2. A method of making diamondlike flakes as claimed in claim 1 wherein the carbon is deposited on the surface of a target from an arc between two carbon electrodes.

3. A method of making diamondlike flakes as claimed in claim 2 including the step of
   ion beam sputtering the surface of the target while simultaneously depositing said carbon thereon.

4. A method of making diamondlike flakes as claimed in claim 3 wherein the surface of the target is sputtered by ions from a source forming a beam of argon ions.

5. A method of making diamondlike flakes as claimed in claim 4 wherein the ion beam sputtering and the carbon arc depositing are performed in a vacuum environment.

6. A method of making diamondlike flakes as claimed in claim 5 wherein the depositing and sputtering are performed at a pressure of about $1\times 10^{-4}$ torr.

| PROPERTY | GRAPHITE | DIAMONDLIKE CARBON | DIAMOND |
|---|---|---|---|
| DENSITY, gm/cm$^3$ | 2.26 | 1.6–2.8 | 3.5 |
| RESISTANCE TO 3H$_2$SO$_4$—HNO$_3$ | NO | YES | YES |
| RESISTIVITY, $\Omega$ cm | $10^{-5}$ | $10^{-5}$ | $10^5$–$10^{20}$ |
| BAND GAP, eV | 0 | 0.5–2.8 | 5 |
| BREAKDOWN STRENGTH V/M | 0 | $10^6$ | $\geq 10^6$ |
| INDEX OF REFRACTION | — | 1.8–2.3 | 2.4 |

ALTERNATE EMBODIMENTS OF THE INVENTION

Other techniques can be employed to produce the diamondlike carbon deposit 36 on the deposition target surface 10. Electron beam evaporation, laser beam evaporation, and electro-thermal evaporation may be used. Also, organic gasses may be brought into the 7. A method of making diamondlike flakes as claimed in claim 5 wherein the target is positioned within 50 centimeters of both the source of argon ions and the carbon electrodes.

8. A method of making diamondlike flakes as claimed in claim 5 wherein the vacuum carbon arc has a low voltage between about 20 and about 40 volts.

9. A method of making diamondlike flakes as claimed in claim 5 wherein the vacuum carbon arc has a high current discharge between about 25 and about 200 amperes.

10. In a method of making diamondlike carbon flakes, the improvement comprising
   depositing carbon on a surface,
   creating diamond $sp^3$ bonds in said carbon, and
   removing diamondlike carbon flakes from said surface.

11. A method of making diamondlike flakes as claimed in claim 10 wherein the carbon is deposited on the surface of a target from an arc between two carbon electrodes.

12. A method of making diamondlike flakes as claimed in claim 10 including the step of
   ion beam sputtering the carbon on the surface with ions having sufficient energy to create the diamond $sp^3$ bonds therein.

13. A method of making diamondlike flakes as claimed in claim 12 wherein the energy in the ions is great enough to create diamond $sp^3$ bonds sufficent to produce a bandgap between about 0.5 eV and about 2.8 eV and an index of refraction between about 1.8 and about 2.3.

14. A method of making diamondlike flakes as claimed in claim 13 wherein the carbon is deposited on the surface simultaneously with the ion beam sputtering.

15. A method of making diamondlike flakes as claimed in claim 14 wherein the ion beam sputtering and carbon depositing are performed in a vacuum environment.

16. A method of making diamondlike flakes as claimed in claim 15 wherein the depositing and sputtering are performed at a pressure of about $1 \times 10^{-4}$ torr or less.

17. Diamondlike flakes made in accordance with the method of claim 10.

18. A diamondlike material having improved electrical and mechanical properties comprising
   carbon flakes having diamond $sp^3$ bonds sufficient to produce a high chemical resistance and high mechanical hardness.

19. A diamondlike material as claimed in claim 18 wherein the diamondlike carbon flakes have a density between about 1.6 gm/cm$^3$ and about 2.8 gm/cm$^3$.

* * * * *